US011880571B2

(12) United States Patent
Muzzetto et al.

(10) Patent No.: US 11,880,571 B2
(45) Date of Patent: Jan. 23, 2024

(54) COUNTER-BASED METHODS AND SYSTEMS FOR ACCESSING MEMORY CELLS

(71) Applicant: Micron Technology, Inc., Boise, ID (US)

(72) Inventors: Riccardo Muzzetto, Arcore (IT); Ferdinando Bedeschi, Biassono (IT); Umberto di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 505 days.

(21) Appl. No.: 17/044,150

(22) PCT Filed: May 13, 2020

(86) PCT No.: PCT/IB2020/020022
§ 371 (c)(1),
(2) Date: Sep. 30, 2020

(87) PCT Pub. No.: WO2021/229260
PCT Pub. Date: Nov. 18, 2021

(65) Prior Publication Data
US 2023/0110946 A1 Apr. 13, 2023

(51) Int. Cl.
*G06F 3/06* (2006.01)
(52) U.S. Cl.
CPC .......... *G06F 3/0614* (2013.01); *G06F 3/0629* (2013.01); *G06F 3/0653* (2013.01); *G06F 3/0679* (2013.01)
(58) Field of Classification Search
CPC .... G06F 3/0679; G06F 3/0614; G06F 3/0619; G06F 3/0629; G06F 3/0653;
(Continued)

(56) References Cited

U.S. PATENT DOCUMENTS 7,864,567 B2   1/2011   Gordon et al.
8,239,735 B2   8/2012   Shalvi et al.
(Continued)

FOREIGN PATENT DOCUMENTS

WO   2021176244   9/2021

OTHER PUBLICATIONS

C. Zhang, M. Huang, L. Okamura and T. Yoshihara, "Error rate decrease through Hamming weight change for NAND Flash," 2010 10th International Symposium on Communications and Information Technologies, Tokyo, Japan, 2010, pp. 1079-1082, doi: 10.1109/ISCIT.2010.5665147. (Year: 2010) (Year: 2010).*
(Continued)

*Primary Examiner* — Khoa D Doan
(74) *Attorney, Agent, or Firm* — Greenberg Traurig

(57) ABSTRACT

The present disclosure relates to a method for accessing an array of memory cells, comprising the steps of storing user data in a plurality of memory cells of a memory array, storing, in a counter associated to the array of memory cells, count data corresponding to a number of bits in the user data having a predetermined first logic value, applying a read voltage to the memory cells to read the user data stored in the array of memory cells, applying the read voltage to the cells of the counter to read the count data stored in the counter and to provide a target value corresponding to the number of bits in the user data having the first logic value, wherein, during the application of the read voltage, the count data are read simultaneously to the user data in such a way that the target value is provided during the reading of the user data, and based on the target value of the counter, stopping the application of the read voltage when the number of bits in the user data having the first logic value corresponds to the target value. A related memory device and a related system are also disclosed.

24 Claims, 8 Drawing Sheets

(58) Field of Classification Search
CPC ..... G06F 2212/7211; G06F 2212/1036; G11C 2211/5644; G11C 2029/0411; G11C 2213/71; G11C 7/1006; G11C 13/004; G11C 13/0026; G11C 13/0033; G11C 13/0035; G11C 16/24; G11C 16/349; G11C 11/5642; G11C 11/5678; G11C 16/26

See application file for complete search history.

(56) References Cited

U.S. PATENT DOCUMENTS

| | | |
|---|---|---|
| 9,099,174 B2 | 8/2015 | Calderoni et al. |
| 9,230,638 B1 | 1/2016 | Lim |
| 9,275,730 B2 | 3/2016 | Tortorelli et al. |
| 9,355,715 B1 | 5/2016 | Kim |
| 9,613,691 B2 | 4/2017 | Mantegazza et al. |
| 10,026,486 B1 | 7/2018 | Dutta et al. |
| 10,431,301 B2 | 10/2019 | Mirichigni et al. |
| 10,566,052 B2 | 2/2020 | Mirichigni et al. |
| 10,636,480 B2 | 4/2020 | Intrater et al. |
| 10,861,537 B1 | 12/2020 | Lien et al. |
| 10,950,315 B1 | 3/2021 | Jeon et al. |
| 11,087,849 B2 | 8/2021 | Chin et al. |
| 11,139,034 B1 | 10/2021 | Sarpatwari et al. |
| 11,194,473 B1 | 12/2021 | Zhao et al. |
| 11,238,945 B1 | 2/2022 | Di Vincenzo |
| 11,295,822 B2 | 4/2022 | Sarpatwari et al. |
| 11,367,484 B1 | 6/2022 | Lee et al. |
| 11,514,983 B2 | 11/2022 | Sarpatwari et al. |
| 2010/0122016 A1 | 5/2010 | Marotta et al. |
| 2013/0016562 A1 | 1/2013 | Mun |
| 2013/0016565 A1 | 1/2013 | Park et al. |
| 2013/0070524 A1 | 3/2013 | Dutta et al. |
| 2013/0132652 A1 | 5/2013 | Wood et al. |
| 2014/0140148 A1 | 5/2014 | An |
| 2014/0160842 A1 | 6/2014 | Takafuji et al. |
| 2014/0229131 A1 | 8/2014 | Cohen et al. |
| 2015/0117129 A1 | 4/2015 | Jung |
| 2016/0125952 A1 | 5/2016 | Hu et al. |
| 2017/0256309 A1 | 9/2017 | Yoon |
| 2018/0040370 A1 | 2/2018 | Tortorelli et al. |
| 2018/0067697 A1 | 3/2018 | Lee et al. |
| 2018/0286488 A1 | 10/2018 | Sanasi et al. |
| 2018/0286495 A1 | 10/2018 | Oh et al. |
| 2018/0341415 A1 | 11/2018 | Koudele et al. |
| 2018/0357535 A1 | 12/2018 | Shulkin et al. |
| 2019/0115078 A1 | 4/2019 | Kim et al. |
| 2019/0172542 A1 | 6/2019 | Miladinovic |
| 2019/0198099 A1 | 6/2019 | Mirichigni et al. |
| 2019/0295660 A1 | 9/2019 | Malshe et al. |
| 2019/0311768 A1 | 10/2019 | Wang et al. |
| 2019/0348127 A1 | 11/2019 | Chin et al. |
| 2019/0348143 A1 | 11/2019 | Zeng et al. |
| 2019/0391914 A1 | 12/2019 | Hsiao et al. |
| 2020/0005862 A1 | 1/2020 | Cariello et al. |
| 2020/0133570 A1* | 4/2020 | Shadmi ................. G06F 3/0659 |
| 2020/0152274 A1 | 5/2020 | Park et al. |
| 2020/0234775 A1 | 7/2020 | Singidi et al. |
| 2020/0364103 A1 | 11/2020 | Sharifi Tehrani |
| 2021/0011769 A1 | 1/2021 | Xie et al. |
| 2021/0012856 A1 | 1/2021 | Xie et al. |
| 2021/0034291 A1 | 2/2021 | Shen et al. |
| 2021/0201995 A1 | 7/2021 | Castro et al. |
| 2021/0202018 A1 | 7/2021 | Hirst et al. |
| 2021/0240385 A1 | 8/2021 | Tai et al. |
| 2021/0312976 A1 | 10/2021 | Pellizzer et al. |
| 2022/0013167 A1 | 1/2022 | Robustelli et al. |
| 2022/0013183 A1 | 1/2022 | Sarpatwari et al. |
| 2022/0068377 A1 | 3/2022 | Lu et al. |
| 2022/0068391 A1 | 3/2022 | Tortorelli et al. |
| 2022/0284957 A1 | 9/2022 | Lee et al. |
| 2022/0319587 A1 | 10/2022 | Sarpatwari et al. |
| 2022/0319606 A1 | 10/2022 | Sarpatwari et al. |
| 2022/0319615 A1 | 10/2022 | Sarpatwari et al. |
| 2023/0017981 A1 | 1/2023 | Jeon et al. |
| 2023/0058300 A1 | 2/2023 | Sarpatwari et al. |

OTHER PUBLICATIONS

C. Zhang, M. Huang, L. Okamura and T. Yoshihara, "Error rate decrease through Hamming weight change for NAND Flash," 2010 10th International Symposium on Communications and Information Technologies, Tokyo, Japan, 2010, pp. 1079-1082, doi: 10.1109/ISCIT.2010.5665147. (Year: 2010).*

R. Maddah, S. Cho and R. Melhem, "Power of One Bit: Increasing Error Correction Capability with Data Inversion," 2013 IEEE 19th Pacific Rim International Symposium on Dependable Computing, Vancouver, BC, Canada, 2013, pp. 216-225, doi: 10.1109/PRDC.2013.42. (Year: 2013).*

Title: Multi-Step Pre-Read for Write Operations in Memory Devices, U.S. Appl. No. 17/154,644, filed Jan. 21, 2021 Inventors: Yen Chun Lee et al. Status: Publications—Issue Fee Payment Verified Status Date: May 18, 2022.

Title: Multi-Step Pre-Read for Write Operations in Memory Devices, U.S. Appl. No. 17/824,776 Inventors: Yen Chun Lee et al. Status: Application Undergoing Preexam Processing Status Date: May 25, 2022.

Title: Adaptively Programming Memory Cells in Different Modes to Optimize Performance, U.S. Appl. No. 17/221,412, filed Apr. 2, 2021 Inventors: Karthik Sarpatwari et al. Status: Docketed New Case—Ready for Examination Status Date: Aug. 23, 2021.

Title: Identify the Programming Mode of Memory Cells based on Cell Statistics Obtained during Reading of the Memory Cells, U.S. Appl. No. 17/221,417, filed Apr. 2, 2021 Inventors: Karthik Sarpatwari et al. Status: Non Final Action dated Jan. 26, 2022.

Title: Identify the Programming Mode of Memory Cells during Reading of the Memory Cells, U.S. Appl. No. 17/221,420, filed Apr. 2, 2021 Inventors: Karthik Sarpatwari et al. Status: Docketed New Case—Ready for Examination Status Date: Aug. 23, 2021.

International Search Report and Written Opinion, PCT/US2022/020391, dated Jun. 16, 2022.

International Search Report and Written Opinion, PCT/US2022/020523, dated Jun. 16, 2022.

International Search Report and Written Opinion, PCT/IB2020/020022, dated Jan. 29, 2021.

D.J.C. MacKay, S.T. Wilson, and M.C. Davey. Comparison of constructions of irregular gallager codes. IEEE Transactions on Communications, 47(10):1449-1454, 1999.

Hangxuan Cui, Jun Lin, and Zhongfeng Wang, "Information storage bit-flipping decoder for LDPC codes", IEEE Transactions on Very Large Scale Integration (VLSI) Systems, 28(11):2464-2468, 2020.

R. Gallager, "Low-density parity-check codes," IRE Transactions on Information Theory, 8(1):21-28, 1962.

Tadashi Wadayama, Keisuke Nakamura, Masayuki Yagita, Yuuki Funahashi, Shogo Usami, and Ichi Takumi, "Gradient descent bit flipping algorithms for decoding LDPC codes", IEEE Transactions on Communications, 58(6):1610-1614, 2010.

Z. Li, L. Chen, L. Zeng, S. Lin, and W. Fong. Efficient encoding of quasi-cyclic low-density parity-check codes. IEEE Transactions on Communications, 53(11):1973-1973, 2005.

International Search Report and Written Opinion, PCT/US2022/021408, dated Jul. 6, 2022.

* cited by examiner

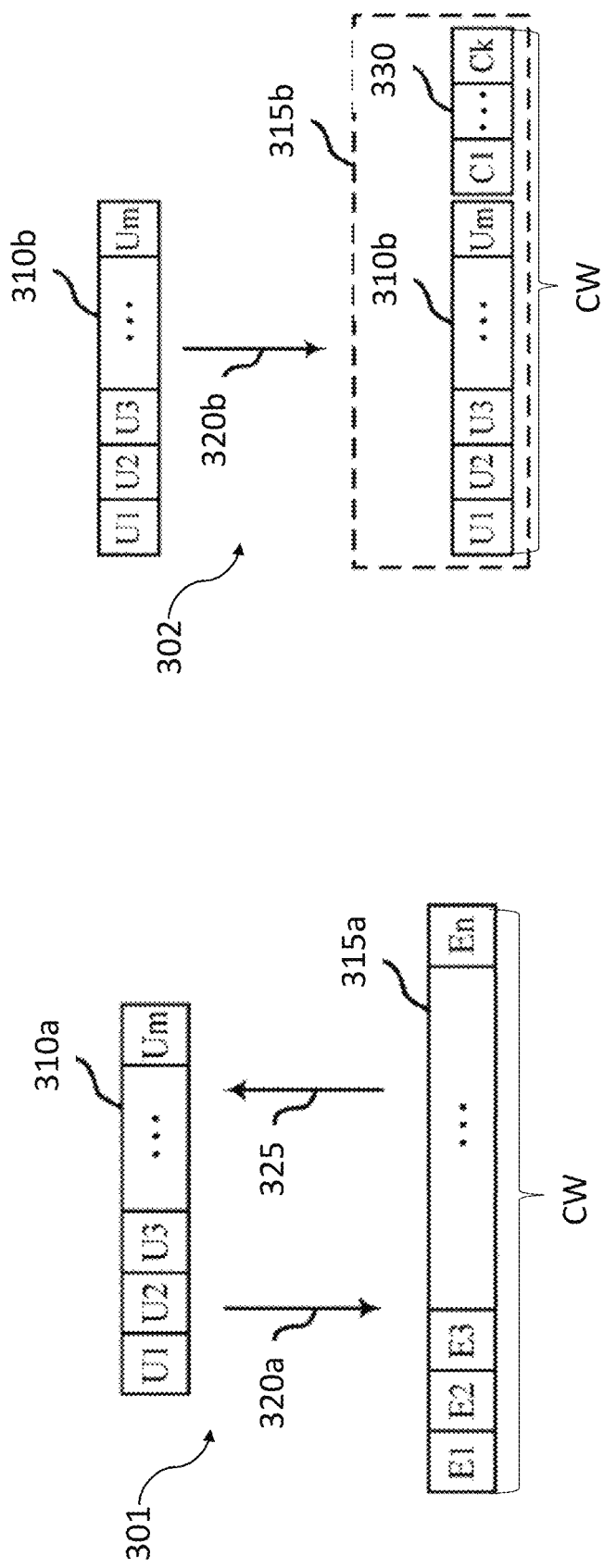

_US 11,880,571 B2_

COUNTER-BASED METHODS AND SYSTEMS FOR ACCESSING MEMORY CELLS

The present application is a national phase application under 35 U.S.C. § 371 of International Patent Application PCT/IB2020/020022, filed on May 13, 2020, the entire disclosure of which applications is hereby incorporated herein by reference.

TECHNICAL FIELD

The present disclosure relates generally to operating an array memory of memory cells, and more particularly to counter-based methods and systems for accessing memory cells.

BACKGROUND

Memory devices are used in many electronic systems such as mobile phones, personal digital assistants, laptop computers, digital cameras and the like. Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Nonvolatile memories retain their contents when power is switched off, making them good choices in memory devices for storing information that is to be retrieved after a system power-cycle. In particular, non-volatile memory cells may maintain their stored logic state for extended periods of time even in the absence of an external power source. Volatile memory cells may lose their stored state over time unless they are periodically refreshed by an external power source.

Information is stored by programming different states of a memory device. For example, binary devices have two states, often denoted by a logic "1" or a logic "0." In other systems, more than two states may be stored. To access the stored information, a component of the memory device may read, or sense, the stored state. To store information, a component of the memory device may write, or program, the logic state.

Improving memory devices, generally, may include increasing memory cell density, increasing read/write speeds, increasing reliability, increasing data retention, reducing power consumption, reducing manufacturing costs, as well as scaling smaller than traditional devices (which may lead to relatively high rates of errors), and the like.

A more robust read technique may be desired to increase memory devices performances and reliability when memory cells exhibit variable electrical characteristics, in particular memory devices having a three-dimensional (3D) array of memory cells.

BRIEF DESCRIPTION OF THE DRAWINGS

FIGS. 3A and 3B illustrate examples of data patterns supporting the counter-based method for reading memory cells according to embodiments of the present disclosure;

DETAILED DESCRIPTION

With reference to those drawings, methods and systems for an improved reading operation of memory cells will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines. Flash memories are well established and well suited for mass storage applications; however, their performances do not meet present day most demanding applications. New technologies, for example 3D Cross Point (3DXPoint) memories and Self-Selecting Memories (SSM) have better performances, for example in terms of access time and access granularity (data may be programmed and read with page, word or—in principle—even bit granularity). Accessing data during a read operation is more and more challenging with scaled technologies.

Figure 1:
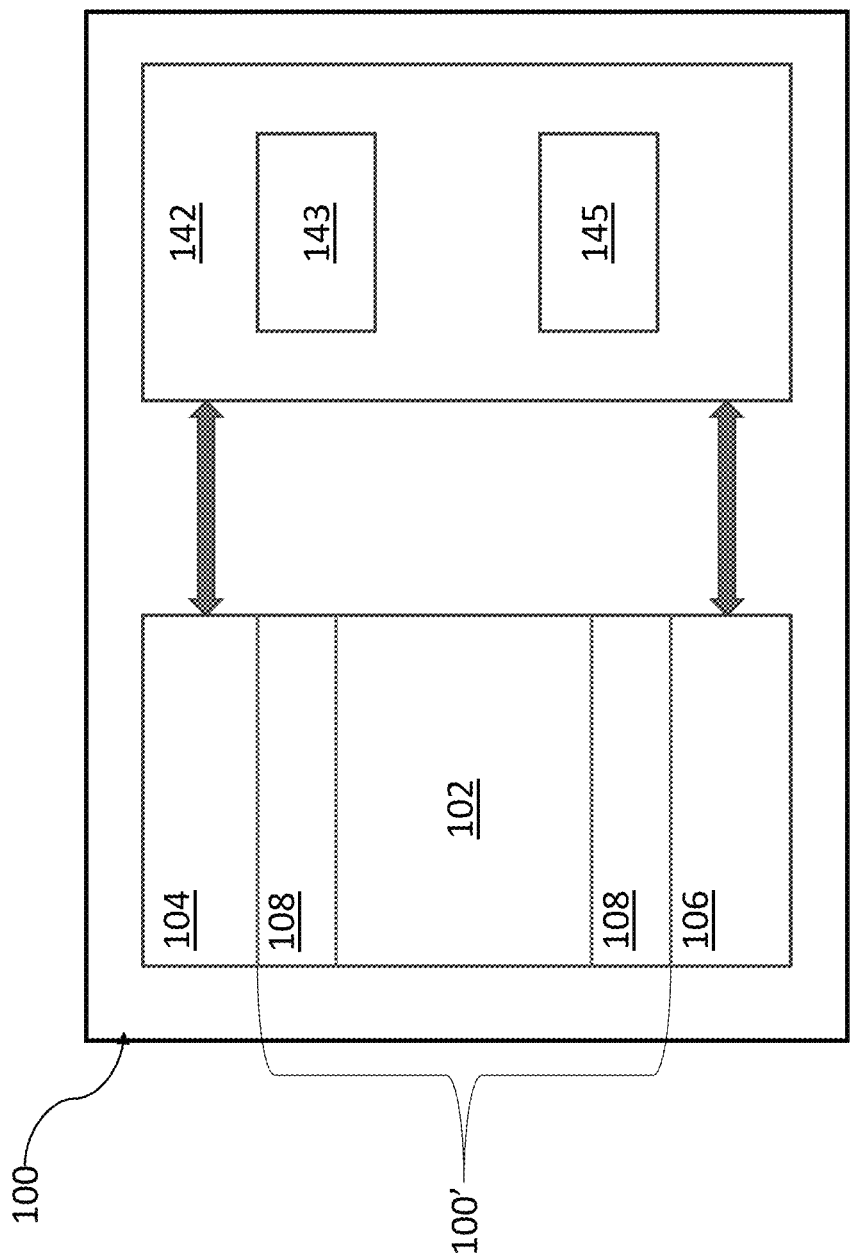
FIG. 1 is an exemplary block scheme illustrating an exemplary memory cell that can be read according to embodiments of the present disclosure.

FIG. 1 illustrates a block scheme of an exemplary assembly 100 comprising a memory cell 100' that can be arranged in an array and then programmed and read according to the present disclosure.

In the embodiment illustrated in FIG. 1, the memory cell 100' includes a storage material 102 between access lines 104 and 106. The access lines 104, 106 electrically couple the memory cell 100' with circuitry 142 that writes to and reads from the memory cell 100'. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to access circuitry 143. Access circuitry can store information in the memory cell 100' by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100' is a self-selecting memory cell that includes a single layer of material that acts as both a selector element to select the memory cell and a memory element to store a logic state, i.e. a state related to a given polarity of the cell.

In one embodiment, the storage material 102 is a phase change material. A phase change material can be electrically switched between a generally amorphous and a generally crystalline state across the entire spectrum between completely amorphous and completely crystalline states. The memory cell 100' may further include a selection device (not shown) between access lines 104 and 106; the selection device may be serially coupled to the storage material 102. In another embodiment, the storage material 102 is not a phase change material. In one embodiment in which the storage material 102 is not a phase change material, the storage material is capable of switching between two or more stable states without changing phase. The access circuitry 143 is able to program the memory cell 100' by applying a voltage with a particular polarity to cause the storage material 102 to be in the desired stable state.

In one such embodiment, programming the memory cell 100' causes the memory cell 100' to "threshold" or undergo a "threshold event." When a memory cell thresholds (e.g., during a program voltage pulse), the memory cell undergoes a physical change that causes the memory cell to exhibit a certain threshold voltage in response to the application of a subsequent voltage (e.g., a read voltage with a particular magnitude and polarity). Programming the memory cell 100' can therefore involve applying a voltage of a given polarity to induce a programming threshold event, which causes the memory cell 100' to exhibit a particular threshold voltage at a subsequent reading voltage of a same or different polarity. In one such embodiment, the storage material 102 is a self-selecting material (e.g., a non-phase change chalcogenide material or other self-selecting material) that can be programmed by inducing a threshold event.

As it is explained in further detail below, the output of such a memory cell when read differs as a function of the polarity used to program the memory cell and the polarity used to read the memory cell. For example, the storage material 102 can exhibit a "lower threshold voltage" or a "higher threshold voltage" in response to a read voltage based on the polarity of both the programming and read voltages. In the context of the present disclosure, exhibiting a threshold voltage means that there is a voltage across the memory cell that is approximately equal to the threshold voltage in response to the application of a voltage with a particular magnitude and polarity to the terminals of the memory cell. The threshold voltage thus corresponds to the minimum voltage that is needed to be applied at the input(s) to produce output(s), i.e. to see a determined electrical response of the cell. In other words, in the context of the present disclosure, the verb "threshold" means that the cells undergo a threshold event, i.e. they have an electrical response in response to the applied voltage that is above a given threshold, thus exhibiting a peculiar threshold voltage.

As mentioned above, the access lines 104, 106 electrically couple the memory cell 100' with circuitry 142. The access lines 104, 106 can be referred to as a bitlines and wordlines, respectively. The wordline is for accessing a particular word in a memory array and the bitline is for accessing a particular bit in the word. In one embodiment, the access lines 104, 106 can be made of one or more suitable metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be made of one or more conductive and/or semiconductive materials such as, for example: carbon (C), carbon nitride (CxNy); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including RuO2, or other suitable conductive materials.

The stack made of electrodes 108 and storage material 102 is hereinafter referred to as the memory cell 100', without limiting the scope of the disclosure. In various embodiments, the memory cell 100' may comprise more or less elements. Therefore, the memory cell 100' is one example of a memory cell. Other embodiments can include memory cells having additional, less, or different layers of material than the ones illustrated in FIG. 1 (e.g., a thin dielectric material between the storage material and access lines and the like).

Referring again to the circuitry 142, the access lines 104, 106 communicatively couple the circuitry 142 to the memory cell 100', in accordance with an embodiment. The circuitry 142 includes access circuitry 143 and sense circuitry 145. Circuitry includes electronic components that are electrically coupled to perform analog or logic operations on received or stored information, output information, and/or store information. Hardware logic is circuitry to perform logic operations such as logic operations involved in data processing. In one embodiment, the access circuitry 143 applies voltage pulses to the access lines 104, 106 to write to or read the memory cell 100'. The terms "write" and "program" are used interchangeably to describe the act of storing information in a memory cell. To write to the memory cell 100', the access circuitry applies a voltage pulse with a particular magnitude and polarity to the access lines 104, 106, which can both select memory cell 100' and program memory cell 100'.

For example, the access circuitry 143 applies a read voltage with one polarity to program the memory cell 100' to be in one logic state, and applies a pulse with a different polarity to program the memory cell 100' to be in a different logic state. The access circuitry 143 can then differentiate between different logic states as a consequence of the programming polarity of a memory cell. For example, in a case of a memory read, the access circuitry 143 applies a voltage pulse with a particular magnitude and polarity to the access lines 104, 106, which results in an electrical response that the sense circuitry 145 can detect. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100' based on electrical responses to one or more of the voltage pulses in a read sequence.

The electric current generated upon application of a reading voltage thus depends on the threshold voltage of the memory cell determined by the electrical resistance of the logic state storage element. For example, a first logic state (e.g., SET state) may correspond to a finite amount of current, whereas a second logic state (e.g., RESET state) may correspond to no current or a negligibly small current. Alternatively, a first logic state may correspond to a current higher than a current threshold, whereas a second logic state may correspond to a current lower than the current threshold.

Figure 2:
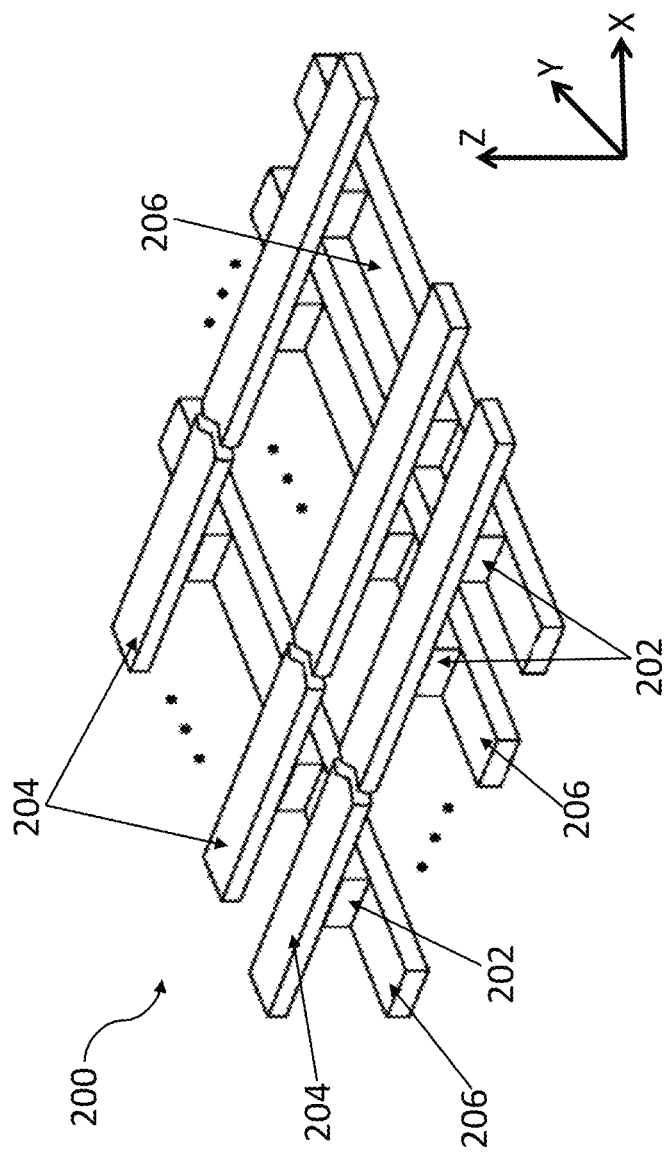
FIG. 2 schematically illustrates a portion of an exemplary memory cell array.

FIG. 2 shows a portion of a memory cell array 200, which can include a plurality of memory cells such as the memory cell 100' of FIG. 1, in accordance with an embodiment. The memory cell array 200 is an example of a three-dimensional cross-point memory structure (3D X Point). The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. As disclosed in relation to FIG. 1, storage material 202 may be a self-selecting storage material, in some examples; storage material 202 may be serially coupled to a selection device (not shown), in other examples. In one embodiment, a "cross-point" is formed at an intersection between a bitline and a wordline. A memory cell is created from the storage material 202 between the bitline and wordline where the bitline and wordline intersect (it is noted that, in FIG. 2, additional layers such as electrodes are not shown, so that the cell is schematically represented by the storage material 202, without limiting the scope of the disclosure, and additional layers may be present). Generally speaking, the intersection defines the address of the memory cell. The storage material 202 can be a chalcogenide material such as the storage material 102 described above with respect to FIG. 1. In one embodiment, the access lines 204, 206 are made of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction).

A "cross-point" thus refers to a place where a memory cell is formed such that access lines associated with the memory cell topologically "cross" each other as access lines connect to different nodes of the memory cell. Cross-point architecture enables reaching the theoretical minimum cell area determined by the minimum pitch of access lines.

FIGS. 1 and 2 illustrate an example of a memory cell and array. However, other memory cell structures and arrays may be used, in which the memory cells exhibit electrical responses that vary as a function of programming and read polarity. A memory cell (not shown) may be formed at crossing locations between vertical conductive pillars, acting as bitlines, intersecting horizontal conductive planes, acting as wordlines, in a 3D memory array, for example. This and other array organizations may also lead to a cross-point architecture as described above.

Ideally, all memory cells of a memory device should feature a same (nominal) resistivity and therefore a same threshold voltage for a same logic state, wherein the threshold voltage is the voltage to be applied to the memory cells for causing them to conduct an electric current, i.e. the minimum value of the voltage that is needed to create a conducting path between the terminals, as above defined. However, since different cells programmed to a same logic state practically exhibit different resistivity values because of several factors (such as for example variations in the electrical characteristics of the phase-change material caused by the execution of a number of read-write operations and/or by manufacturing tolerances), each logic state is actually associated to a respective resistivity distribution (typically a Gaussian-type distribution), and therefore to a respective threshold voltage distribution.

In order to assess the logic state of a cell, a reading operation is carried out to assess to which threshold voltage distribution the threshold voltage of the cell belongs. For example, a reading voltage may be applied to the cell via access lines and the logic state of the cell is assessed based on (the presence or absence of) a current responsive to said reading voltage, the (presence or absence of the) current depending on the threshold voltage of the cell. A cell thresholds (e.g., it becomes conductive) when a suitable voltage difference is applied between its two terminals; such a voltage difference may be obtained in different ways, for example biasing one terminal, such as a wordline terminal, to a negative voltage (e.g. a selection voltage), and the other terminal, such as a bitline terminal, to a positive voltage (e.g. a reading voltage). Other biasing configurations may produce the same effects (e.g., both the word line and the bitline terminal biased to positive voltage, or the wordline terminal biased to a reference voltage, e.g. a ground voltage, and the bitline terminal biased to a positive voltage).

In other words, operations such as reading and writing, which may be referred to as access operations, may be performed on memory cells by activating or selecting a wordline 206 and bitline 204. As known in the field, wordlines 206 may also be known as row lines, sense lines, and access lines. Bitlines 204 may also be known as digitlines, column lines, data lines, as well as access lines. References to wordlines and bitlines, or their analogues, are interchangeable without loss of understanding or operation. For example, the access lines may be wordlines and the data lines may be bitlines. Wordlines 206 and bitlines 204 may be perpendicular (or nearly perpendicular) to one another to create an array, as previously shown with reference to FIG. 2. Depending on the type of memory cell (e.g., FeRAM, RRAM, etc.), other access lines (not shown in the figures) may be present, such as plate lines, for example. It should be appreciated that the exact operation of the memory device may be altered based on the type of memory cell and/or the specific access lines used in the memory device. Activating or selecting a wordline 206 or a bitline 204 may include applying a voltage to the respective line via a dedicated driver. By activating one wordline and one bitline, a single memory cell 202 may be accessed at their intersection. Accessing the memory cell may include reading or writing the memory cell.

Accessing memory cells may be controlled through a row decoder and a column decoder (not shown). For example, a row decoder may receive a row address from a memory controller and activate the appropriate wordline based on the received row address. Similarly, a column decoder may receive a column address from the memory controller and activate the appropriate bitline.

As mentioned before, in some cases, memory cells 202 may exhibit different electrical characteristics after a number of cycling operations (e.g., a series of read or write operations). For example, a threshold voltage of a memory cell 202 (e.g., PCM cell) corresponding to a logic state of 1, after receiving an identical programming pulse to store the logic state of 1 (e.g., a SET programming pulse), may be different if a memory cell is relatively new (e.g., a PCM cell with a small number of read or write operations) compared to a memory cell having been cycled through an extensive number of read or write operations. In addition, in some cases, a chalcogenide material in the memory cells (e.g., the logic storage element 102 or 202) may experience a change (which may also be referred to as a drift) in its resistance after programming (e.g., crystallizing or quenching) of the chalcogenide material during a write operation. Such change in resistance may result in changes in threshold voltages of memory cells and may hinder accurately reading information from memory cells (e.g., PCM cells) after a certain period of time elapsed. In some embodiments, the amount of change may be a function of ambient temperature. In many cases, it may be impractical to rely on error correction mechanisms to handle the errors.

The present disclosure provides a robust and reliable read technique also when memory cells (e.g., PCM cells or SSM cells) exhibit different, non-uniform, variable electrical characteristics that may originate from various factors including statistical process variations, cycling events (e.g., read or write operations on the memory cells), or a drift (e.g., a change in resistance of a chalcogenide alloy), among others, as described above.

More in particular, according to the memory cell read techniques of the present disclosure, the reading of a set of user data (e.g., a codeword, a page) is carried out simultaneously to the reading of the data stored in a memory portion (hereinafter referred to as counter) associated to the array of memory cells, the data of the counter being used to properly read the user data. The present disclosure may thus determine a total number of memory cells associated with a given logic state through a very effective reading operation, providing a new and more efficient solution based on a counter-based sense amplifier method for reading memory cells, in particular in 3D memory devices.

FIG. 3A illustrates an exemplary user data pattern diagram 301. The user data pattern diagram 301 includes user data 310*a* and encoded user data 315*a*. Encoding process 320*a*, which is performed in the programming phase of the array of memory cells, may convert the user data 310*a* into the encoded user data 315*a*. The encoded user data 315*a* may be stored in a set of memory cells, which may be, for example, memory cells 100' or 202 described with reference to FIGS. 1 and 2. Each box of the encoded user data 315*a* may correspond to a memory cell that may exhibit a logic state of 1 or a logic state of 0. During the encoding process 320*a*, a number of parity bits may be added to the user data 310*a* to establish a predetermined number of bits of the encoded user data 315*a* having a given logic value (e.g., a logic value of 1). As a result, a number of bits in the encoded user data 315*a* may be greater than the number of bits in the user data 310*a* (e.g., n is larger than m if some bits, e.g. parity bits, are added). Process 325 may convert the encoded user data 315*a* back to the user data 310*a* after the encoded user data 315*a* have been accurately read.

In an embodiment, the plurality of encoded bits to be read represents a codeword (CW). The codeword could include various information to be used during the reading phase.

In some embodiments, for each set of user data 310*a*, corresponding encoded user data 315*a* may have a same number of memory cells exhibiting a logic state of 1 and a logic state of 0 (which may also be referred to as a balanced encoding scheme, where half of the encoded user data bits have a logic value of 1, and the other half have a logic value of 0). As such, the encoded user data may be referred to have a 50% weight. In some embodiments, for each user data 310*a*, corresponding encoded user data 315*a* may have a predetermined number of memory cells exhibiting a given logic state (e.g., a logic state of 1), hence producing a constant weight that may be different than 50% (which may also be referred to as a constant weight encoding scheme). In general, an outcome of the encoding process 320*a* may be that a predetermined number of memory cells exhibiting a given logic state (e.g., a logic state of 1) in the encoded user data 315*a* is established.

In other words, according to an embodiment of the present disclosure, the codeword may be manipulated to constrain the number of bits exhibiting a given logic value (e.g. a logic value of 1) to a known desired predetermined value, generally between a minimum value and a maximum value (e.g., between {Min1, Max1} or within a range), by adding some extra bits of information. Therefore, in some embodiments, the memory cells of the array may be configured to store encoded user data that include modified user data (or original user data, in some cases) and a number of bits which may be added thereto, i.e. a data manipulation is performed to constrain the number of bits having a preterminal logic value (e.g. the number of 1s) in a codeword by few (e.g. 2-4) parity or inversion bits. In this way, the statistics of the codeword is improved by using distributions having a reasonable number of bits in a given logic value, in particular having a predetermined number of bits having a logic value 1, or having a number of bits having a logic value of 1 in a given range, facilitating the reading operation and avoiding extreme cases with very few bits exhibiting the first logic value. This also allows to statistically track usage (e.g. drift and cycling) of the codeword with few extra bits, as well as improving speed.

In the context of the present disclosure, a bit having the logic value of 1 (e.g. corresponding to a cell in the logic state 1) is identified as a bit in a first logic state, whereas a bit having the logic value of 0 (e.g. corresponding to a cell in the logic state 0) is identified as a bit in a second logic state, even if other definitions may be used.

Therefore, the present disclosure provides, in the programming phase, the storage of user data (such as the encoded user data 315*a*) in a plurality of memory cells of the memory array, said data being subjected to encoding schemes as previously described. More in particular, the user data may be encoded in a codeword having a predetermined number of bits exhibiting the first logic value. For example, in an embodiment, the encoded user data may have a same number of bits having the logic value of 1 and the logic value of 0, i.e. the encoded user data have substantially a same number of bits exhibiting the first logic value and the second logic value, even if other configurations in which the encoded user data have a known predetermined number of bits in the first logic value may be used.

Moreover, the methods and systems of the present disclosure use a codeword portion, i.e. the above-mentioned counter, having bits protected with ECC and/or with other mechanisms like a voting scheme. A set of memory cells of the array is thus configured to store user data, while an additional set of memory cells is configured to store counting information in the counter. In an embodiment, the counting information may represent a number of bits in the user data having the logic state of 1. The counting information is hereinafter referred to as count data.

FIG. 3B illustrates an example of user data pattern diagram 302 that supports the memory cell read techniques of the present disclosure. The user data pattern diagram 302 includes user data 310$b$ and encoded data 315$b$. Encoding process 320$b$ may encode the user data 310$b$ into the encoded data 315$b$. The encoded user data may include the user data 310$b$ in addition to count data 330. As already discussed with reference to FIG. 3A, an encoding scheme may include adding a number of extra bits (which may also be referred to as parity bits or inversion bits) to the user data during the encoding process, so that the encoded user data 310$b$ may be different from the starting user data as a result of process 320$b$.

In some embodiments, an encoding scheme is used to store counting information in the form of count data 330 corresponding to a total number of bits in the user data having a given logic state (e.g., a logic state of 1) in a number of memory cells. The counting information may be stored as a binary number that represents the total number of bits in the user data having the given logic state. In other cases, the counting information may be encoded to have a weight pattern of a given weight (e.g., 20%, 30%, 50%, i.e. one-half of the memory cells storing the counting information have the given logic state, 75% and the like), as it will be detailed in the following. In some cases, the encoding scheme may result in the total number of bits in the user data having a given logic state (e.g., a logic state of 1) being in a predetermined weight range (e.g., 48%-50%, 40%-48%, 40%-45%, or 20%-25%, for example) rather than an exact predetermined weight. Some additional bits may be programmed to obtain an exact weight, in some cases.

In an embodiment, the number of memory cells of the count data 330 may be determined by a length of the user data 310$b$. In some cases, the count data 330 includes k memory cells when the user data is $2^k$ bits long. In other cases, the count data 330 may include 2×k memory cells when the user data is $2^k$ bits long. In other words, k may be the number of bits used to obtain a perfect balanced code with a $2^k$ codeword length, wherein often the number of bits having the value 1 is maintained in a given interval [x; $2^k/2$] with a lower number of extra bits than k.

In some embodiments, during the encoding process 320$b$, a total number bits having a given logic value (e.g., a logic value of 1) of the user data 310$b$ may be identified and said total number may be stored in the count data 330 (e.g., as a binary number). As an example, when the user data 310$b$ is 16 bits long (e.g., $2^4$ bits long) and has 9 bits out of 16 bits having a logic state of 1, the count data 330 is 4 bits long and corresponds to a binary number 1001. In other embodiments, during the encoding process 320$b$, the total number of bits exhibiting a given logic value (e.g., a logic value of 1) of the user data 310$b$ may be identified and the total number may be encoded in the count data 330 by converting each digit of the binary number (e.g., 1001) to a pair of digits (e.g., a binary digit of 1 to 10 and a binary digit of 0 to 01). Using the same example described above, when the user data 310$b$ is 16 bits long (e.g., $2^4$ bits long) and has 9 bits (e.g., a binary number of 1001) exhibiting a logic value of 1, the count data 330 may be 8 bits long and correspond to 10010110. Such an encoding provides the count data 330 to have a balanced weight of 50%, as will be discussed also in the following.

An outcome of the encoding process 320$b$ may thus be that a known number of memory cells having a given logic state (e.g., a logic state of 1) in the user data 310$b$ is established and then stored in the count data 330. In any case, according to the present disclosure, the value stored in the counter is used to accurately read the user data 310$b$.

Therefore, the present disclosure provides storing in a counter, associated with the array of memory cells, information (i.e. the count data) corresponding to a total number of bits in the user data having a given logic value (e.g., the first logic value of 1). More in particular, in an embodiment, storing count data into the counter may comprise storing into the codeword the target number of bits having the first logic value, i.e. the target of 1s.

Moreover, according to an embodiment of the present disclosure, the counter bits are the result of a difference between the target (total) number of bits having the first logic value and the minimum number of expected bits having said first logic value (i.e. Counter Bits=Target1s−Min1s), instead of storing only the target number of bits which can be as big as Max 1s, i.e. as the maximum number of bits having the first logic value. This scheme is beneficial as it reduces the number of stored counter bits. In other words, storing the count data may comprise storing the difference between the target value and the minimum value of bits of the user data having a given logic value that must be stored in the codeword, in particular the first logic value of 1.

Alternatively, complement at 2 of the target number of bits is stored.

In any case, according to the present disclosure, the codeword CW comprises User Data (e.g. codeword user data portion 310$b$)+Count Data (e.g. codeword count data portion 330), as shown in FIG. 3B.

As mentioned above, an embodiment of the present disclosure provides for balancing the counter in such a way that it comprises a known predetermined number of bits having the first logic value. In other words, the counter may be manipulated with extra bits of information so that it comprises a controlled number of bits having a given logic value (e.g. a controlled number of bits having the first logic value 1). As an example, the counter may have a 50% balanced scheme (as shown previously), or it may have another predetermined fixed number of bits having the first logic value 1 different from 50%.

This allows to obtain the target value (and then to stop the read of the counter) when the known number of counter bits having the first logic value is read during the reading operation thereof. In other words, when the preset expected number of bits having the first logic value is read, the reading of the counter bits is to be considered finished and the target value may be used in the reading algorithm for properly reading the user data of the codeword. For example, in case the counter has a 50% balanced scheme, the read operation of the counter is finished when half of the counter bits are read.

Therefore, in an embodiment, the present disclosure provides for a balancing scheme to stop the read of the counter when the expected number of 1s is reached. This is obtained by manipulating the counter with extra information till it becomes with a controlled number of 1s. The target value of the counter is provided and used when the predetermined number of bits in the counter having the first logic value 1 is read.

This allows for the counter DL discharge as the counter reaches the target, minimizing reset read disturb (RRD) on counter cells, since switching off the bitlines immediately after the switching reduces said disturb.

The sensing phase may count all the logic values "1" of the user data and compare them with the value given by the bits contained in the counter portion 330, i.e. with the target value. Then the reading phase may be stopped if there are no cell errors.

The reading of the codeword may be further improved according to the present disclosure. More in particular, the present disclosure relies on encoding schemes that provide, via the count data, a precise number of memory cells having a given logic state, in particular the first logic state 1, which enables reading the user data accurately regardless of the different electrical characteristics of memory cells. Suitably according to the present disclosure, the count data are determined while the user data are being read.

Figure 4A:
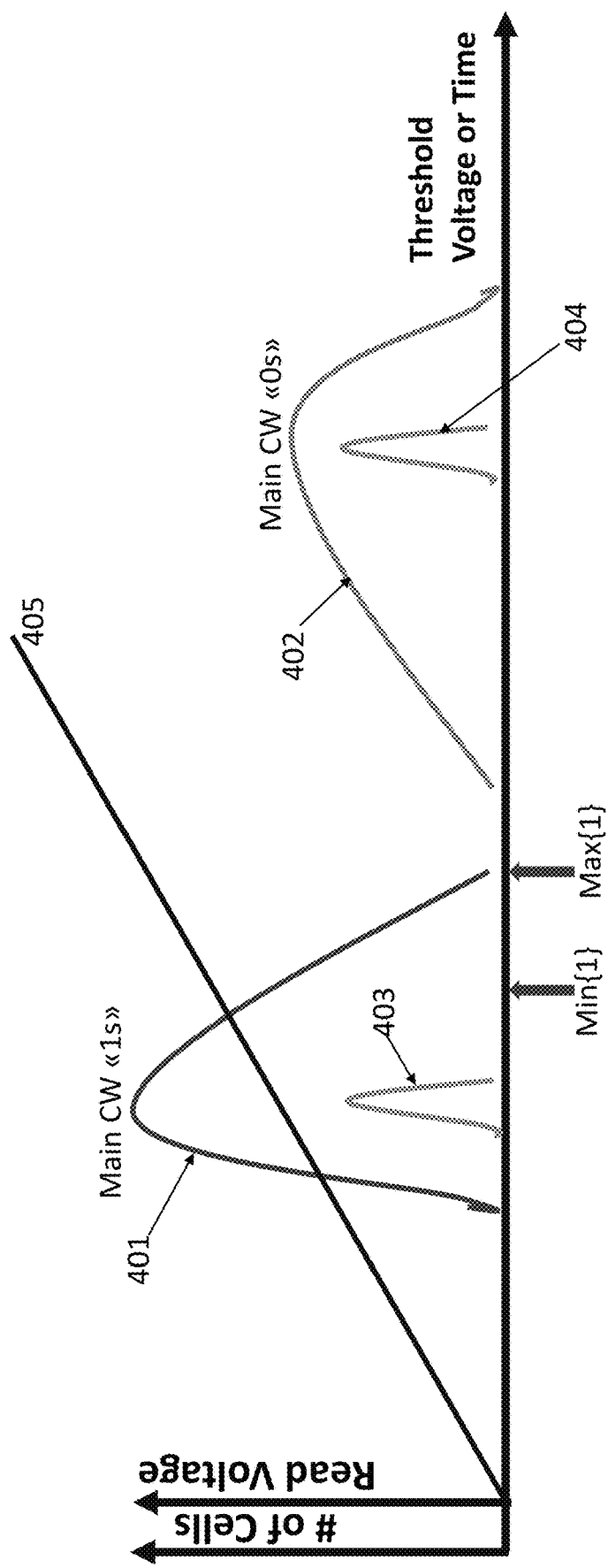
FIGS. 4A and 4B schematically illustrate distributions of logic states exhibited by memory cells during the reading phase according to embodiments the present disclosure.

FIG. 4A shows, in a schematic manner, the distributions of the logic states exhibited by the memory cells during the reading phase according to the present disclosure. For example, the shown distributions may originate from variable electrical characteristics of the cells of the array. Cell distribution curves are represented with respect to vertical axis "# of Cells" and horizontal axis "Threshold Voltage". Reading voltage is represented with respect to vertical axis "Read Voltage" and horizontal axis "Time".

It is worth noting that when the applied read voltage and the programming voltage have same polarity, the magnitude of the threshold voltage is low. For example, positive programming voltage (e.g. corresponding to a logic state "1") results in a lower threshold voltage. The logic state "1" may be determined by applying a positive read voltage, resulting in said lower threshold voltage, as distribution 401 shown in FIG. 4A. When the applied read voltage and the programming voltage have different polarities, the magnitude of the threshold voltage is high. For example, negative programming voltage (e.g. corresponding to logic state "0") results in higher threshold voltage when read in positive polarity, as distribution 402 shown in FIG. 4A. Therefore, cells in logic state "0" do not threshold when biased with positive low read voltage. Access circuitry can determine the logic state of memory cells based on the electrical responses of the memory cells to the application of a read voltage.

In FIG. 4A, the distributions of the counter bits are referred to as 403 and 404 and are narrower than the distributions 401 and 402 (because the counter comprises a lower number of bits) and statistically are substantially centered around the peak of said distributions. Distributions 401 and 402 of FIG. 4A may correspond to bits contained in the codeword portion 310b of FIG. 3B and distributions 403 and 404 of FIG. 4A may correspond to bits contained in the codeword portion 330 of FIG. 3B.

A read voltage 405 is then applied to the memory cells of the array to read the user data stored therein. At the same time, said read voltage is also applied to the cells of the counter to read the count data stored in the counter so as to provide the target value corresponding to the number of bits in the user data having the first logic value, e.g., in an embodiment, the logic value 1. In this way, during the application of the read voltage 405, the count data are read simultaneously to the user data in such a way that the target value is provided during the reading of the user data. In other words, advantageously according to the present disclosure, the bits of the counter are read at the same time as the bits of the main codeword containing user data stored in the array.

Sense circuitry detects the electrical response of the plurality of memory cells to the applied read voltage 405 (e.g. a threshold voltage across terminals of the cells), and, based on the threshold voltages, a logic state to one or more cells of the plurality of memory cells is associated. As shown in the embodiment of FIG. 4A, the memory cells exhibit a threshold voltage with a lower magnitude when the memory cells are in the first logic state 1, and a threshold voltage with a higher magnitude when the memory cells are in the second opposite logic state 0.

In an embodiment of the present disclosure, the read voltage 405 is a voltage ramp and, preferably, said voltage ramp is a variable staircase voltage ramp.

In an embodiment, as shown in FIG. 4A, the read voltage 405 applied to the cells of the array containing user data (i.e. the read voltage applied to read distributions 401 and 402) is the same as the read voltage applied to the cells containing count data (i.e. the read voltage applied to read distributions 403 and 404). In other words, a first read voltage for memory cells storing user data and a second read voltage for memory cells storing count data may be a same voltage (i.e. only one voltage) applied at the same time to the cells of the array. The read voltage(s) may be voltage ramp(s), e.g., staircase voltage ramp(s).

Figure 4B:
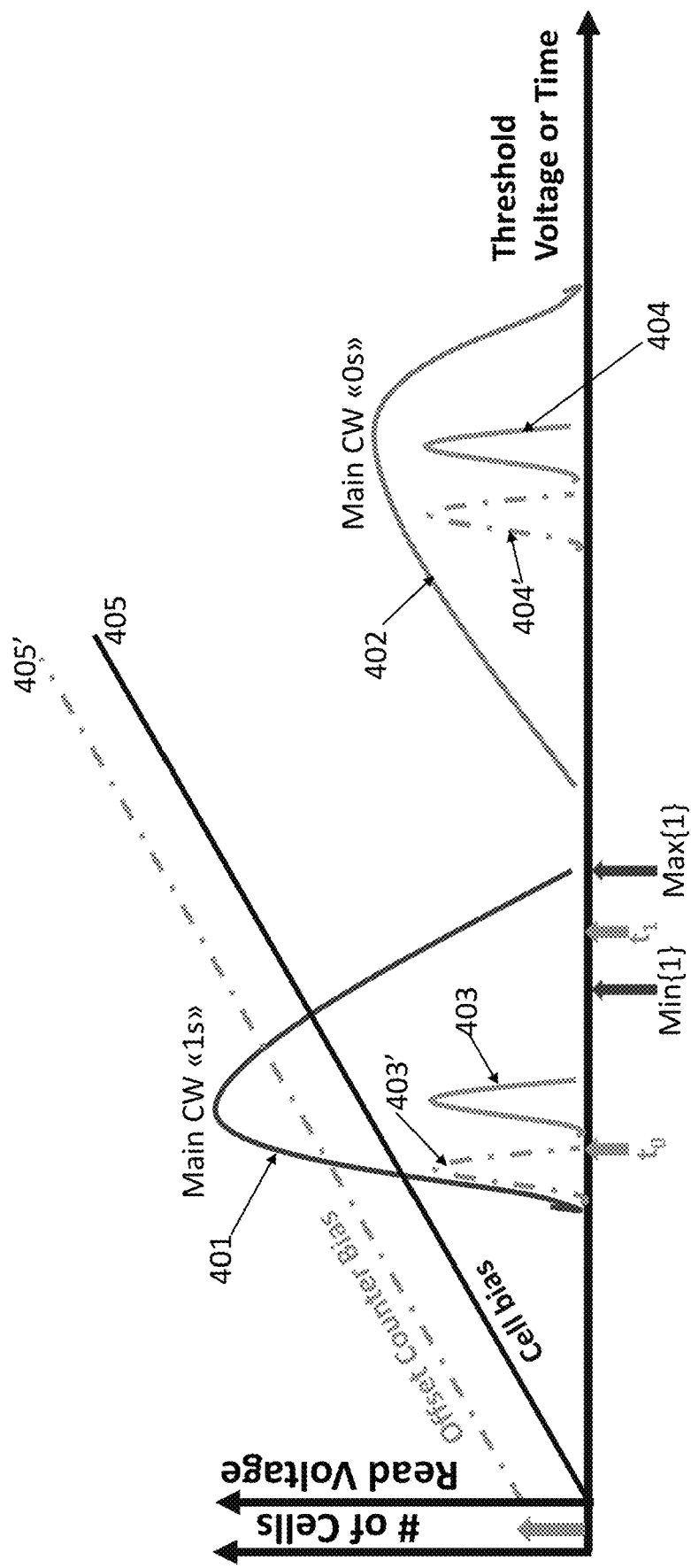

According to another embodiment shown in FIG. 4B, a voltage ramp 405, e.g., a first voltage ramp 405, (represented with respect to vertical axis "Read Voltage" and horizontal axis "Time") is applied to the cells containing user data (i.e. to read distributions 401 and 402—represented with respect to vertical axis "# of Cells" and horizontal axis "Threshold Voltage"), and an offset voltage ramp 405', e.g., a second voltage ramp 405', is applied to the cells of the counter (i.e. to read distributions 403' and 404', which therefore appear to be shifted in time). In this embodiment, the second read voltage 405' is voltage offset with respect to the first read voltage 405 by a predetermined voltage offset. For instance, the offset may be 250 mV (the offset may be limited by the expected minimum threshold voltage in the distribution of memory cells programmed at the logic state 1).

The offset read voltage 405' may be generated from the read voltage 405, or vice-versa, for example by means of hardware components such as a diode or a voltage divider.

The offset read voltage 405' applied to the counter cells addresses double distributions cases and provides counter readiness before the main codeword is actually going to require for, as schematically shown in FIG. 4B. Referring to FIG. 4B, the count data are ready at to and they are actually needed after $t_1$ (i.e. approaching the end of the distribution), so that the target value of the counter is available earlier during the reading operation and then it can be properly used in the reading algorithm. In this way, a useful time margin in the reading of the counter bits is achieved. In other words, due to the application of a voltage offset to the counter cells by modifying the supply voltage used to generate the voltage for the related sense circuits, the counter bits are anticipated by a time margin, i.e. the counter bits are read earlier with respect to a condition where the ramp has no offset, so that the counter distributions that are actually seen during the reading operation are the distributions 403' and 404' of FIG. 4B. This is beneficial in that, since at the beginning of the application of the read voltage the count data are not yet available, the offset allows having and using said data in advance. In other words, a first read voltage may be applied for reading memory cells storing user data and a second read voltage may be applied for concurrently, e.g., simultaneously, reading memory cells storing count data. The second read voltage may be voltage offset with respect to the first reading voltage. The offset may be such that an instantaneous amplitude of the first second reading voltage is greater than a simultaneous instantaneous amplitude of the first reading voltage. The first and second read voltages may be voltage ramps, e.g., staircase voltage ramps.

As previously disclosed, the user data and the count data are read simultaneously and, at the beginning of the application of the read voltage (either or both the first read voltage and the second read voltage), the count data (whose distribution is centered around the peak of the user data distribution and is narrower) are still not available to be used in the reading algorithm. For example, after the application of a first read pulse (which allows reading a certain number of user data bits, i.e. up to the peak of the distribution), an instruction relating to the application of a subsequent reading pulse is to be provided based on the read count data; however, at the beginning of the read operation, the count data are still not read and the counted user data bits are greater than the counter bits, which would result in an undesired stop of the reading operation.

For this reason, in an embodiment of the present disclosure, a command is generated to enable the application of the read voltage, e.g., the first read voltage, for reading the user data until all the counter bits are read and the target value is provided, i.e. such command avoids that the read voltage for reading the user data is interrupted due to the lack of count data from the counter. Once the count data are read, the enabling command is not generated anymore and said count data are used in the reading algorithm to perform the proper reading of the user data. Based on the read count data, the (first) read voltage is then selected as the voltage that corresponds to a deterministic number of bits having the first logic value during the read operation, the read voltage being increased until the number of counted user data bits in the first logic value reaches the target value provided by the count data.

The target value provided by the counter is thus used to stop the reading of the user data when the number of bits in the user data having the first logic value is equal to said target value.

In other words, the generation of the enabling command corresponds to the use of a fake counter pointing to the most likely codeword (i.e. having a fake number of bits pointing to the most likely codeword to avoid interruption of the read voltage), this fake counter being used until the balanced read of the actual counter is triggering the reached target value and swaps the fake counter with the actual one. The fake counter is thus used until the value (i.e. the balanced value) of the actual counter has been read and the target enable command is generated and used in the reading algorithm.

As seen before, the counter may be considered as read when all the bits of the counter exhibiting the first logic value, as established in the balancing scheme, is read. For example, if the count data have been encoded according to a balancing scheme with 50% weight (i.e. the same number of 1s and 0s), the count data are considered as read when half of the counter bits have been read, and then the count data may be substitute to the enabling command to perform the proper reading of the remaining user data cells.

Figure 5:
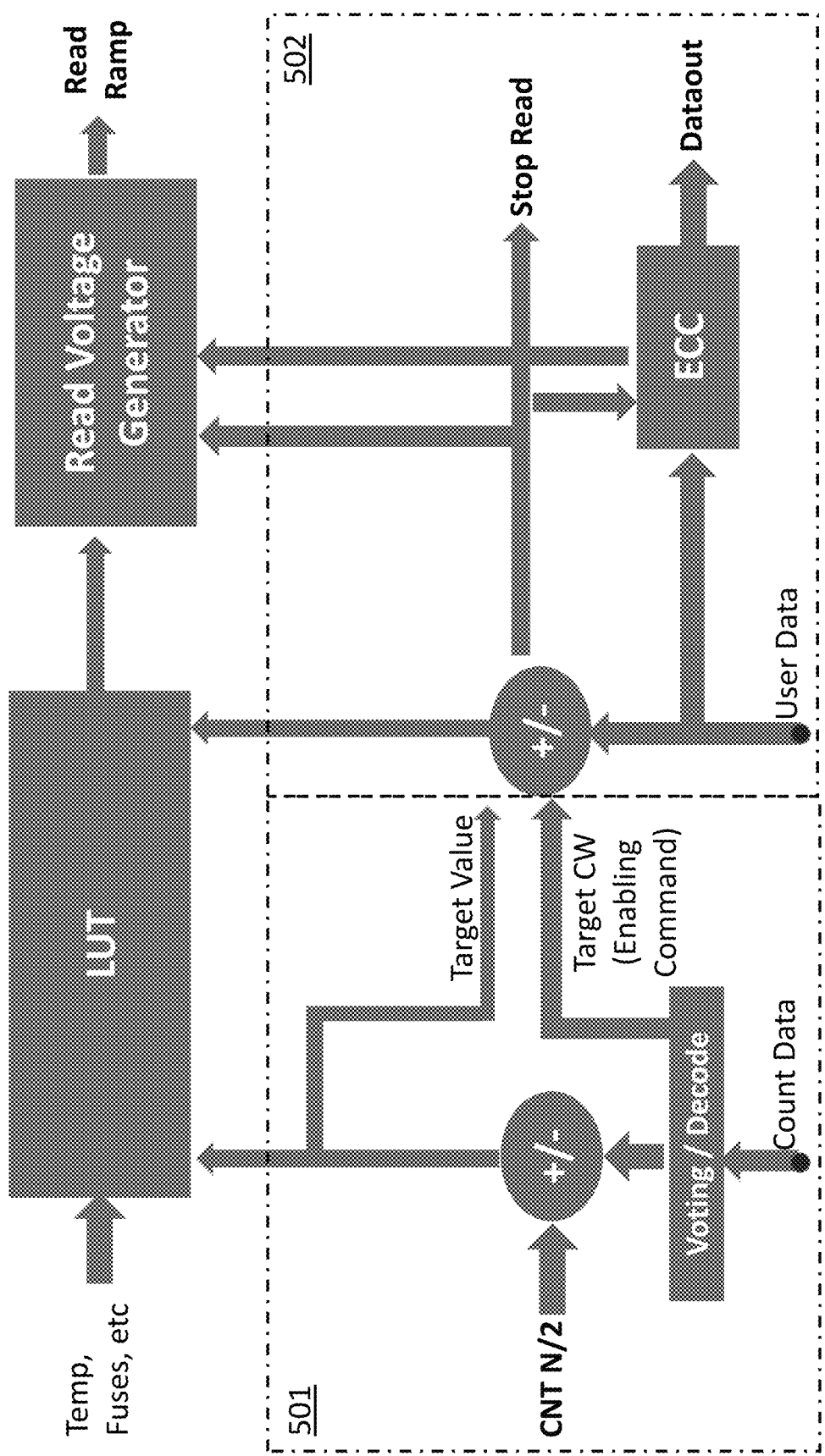
FIG. 5 schematically illustrates logic blocks of a reading algorithm operating according to the method of the present disclosure.

FIG. 5 shows logic blocks of a reading algorithm operating according to the present disclosure. The count data are read from the counter and are used "on the fly" during the execution of the user data reading algorithm, i.e. the reading blocks 501 and 502 are performed in parallel. The read count data are introduced into the algorithm while the user data are being read, improving the reading performances. In the time frame where the count data are still not completely read, the enabling command (i.e. the fake counter) is used to enable the reading of the user data until the reading operation of the counter is complete and the target value is finally provided.

At block 501, since counter is balanced, the enabling command (i.e. the fake counter) pointing to the most likely codeword is used until the counter has reached the balanced value and generates a signal indicating that the target value is ready and can be used in the counter-based reading algorithm, and the proper reading of the user data is thus performed at block 502.

When the target value of the counter is read, said value is used in a Lookup Table (LUT) for the generation of the proper read voltage, in particular for the definition of all the subsequent read voltage pulses to be applied to the memory cells of the array. The value of the counter is thus transmitted to the Lookup Table and a read voltage generator (e.g. a Ramp DAC generator) receives all the information for the generation of the ramp.

The present disclosure thus provides the simultaneous reading of counter bits and data bits, wherein the counter bits are read as if they were bits of the main codeword, providing a new approach instead of reading the counter first and then downloading it into the read voltage generator.

As previously shown, at the beginning of the application of the read voltage, the counter bits have still to be read (which would result in an undesired stop of the read operation). In an alternative embodiment of the present disclosure, in order to solve this issue, the counter bits are counted starting from the maximum number thereof, and then said maximum number is decremented until all the counter bits are read. Therefore, in this embodiment, each time a bit of the counter is switched due to the application of the read voltage, the counted value is decremented from the maximum value.

In this way, a decoding logic scheme is applied to the counter bits so that the count data are initially stored as data that have already been read (i.e. said data are to be counted starting from the maximum number of bits thereof and the count is decremented). Therefore, according to this embodiment, at the beginning of the read operation, the number of counter bits is greater than the number of bits having a predetermined logic value read in the user data and the reading operation may continue without interruption, the number of counter bits being then decremented during the reading operation.

When all the bits in the counter are switched (read) due to the application of the read voltage, the target value is provided as the number of switched counter bits and the read operation can be stopped when the number of read user data bits corresponds to said number of switched count data bits, i.e. matches the target value. Due to the distribution shape as discussed with references to FIGS. 4A and 4B, since the reading operation of the user data and of the count data occurs in parallel, the data from the counter are read before the time $t_1$, where it is actually needed.

In other words, in this embodiment, the bits of the counter are inverted (e.g. logically or by means of an inverter) in such a way that, at the beginning of the read operation, the application of the read pulse is not interrupted as the counter bits are counted from their maximum value. In this embodiment, it is not necessary to use a balancing scheme for the counter.

In this case, as previously mentioned, complement at 2 of the target number of bits is stored, i.e. max-target is stored and in order to start with the maximum value and decrement it the complement of max-target is obtained.

In general, the application of the read voltage is based on the read target value of the counter, and it is stopped when the number of bits of the user data having a predetermined logic value (e.g. the first logic value 1) corresponds to the value stored in said counter.

According to an embodiment of the present disclosure, the user data are evaluated runtime during the application of the read voltage. Alternatively, the user data are evaluated after the target value is read, i.e. user data bits are evaluated after the target signal is generated representing that counter has been properly read.

According to an embodiment of the present disclosure, the bits of the counter are stored and read according to a majority voting scheme, e.g. a 3× voting scheme wherein one counter bit corresponds to three array cells, even if this scheme may be applied to N array cells of the counter. Generally, the number of voting is selected depending on raw BER. The present disclosure thus provides the use of a balanced code with voting scheme to the counter cells, so that the count data are balanced data (e.g. four is as a target) and each bit is protected by a voting scheme (e.g. 3× voting scheme).

The counter is therefore protected against reliability issues and BER is reduced by applying redundant information or correction schemes, or a combination thereof, e.g. a voting scheme such that one counter bit corresponds to N array cells (e.g. N=3), differential cells so that one counter bit corresponds to one array cell at 0 and one array cell at 1, as well as error correcting schemes, using counter parity bits, each bit out of voting or differential. All these schemes may be also be combined with each other.

Moreover, it is also possible to differentiate the protection level of the counter bits. For example, in an embodiment of the present disclosure, LSB of the counter are more protected than MSB (e.g. LSB with voting 5× and MSB with voting 3×). Therefore, LSB bits may have a stronger protection since they are related to the most likely CW.

In an embodiment, the user data are protected using an Error Correction Code (ECC) and/or a differential cells scheme.

Summing up, according to the present disclosure, the user data bits and the counter data bits are read at the same time, so that the counter value is not read before the user data but is read with the user data and used on-the-fly while reading the user data.

The disclosed counter-based read algorithm has many benefits, including a very fast self-reference (three or four steps), with no download overhead latency since the counter is read in parallel to the main codeword. Moreover, the user data cells and the counter cells require the same design architecture (e.g. same sense amplifiers, decoders, arrays etc.) since the counter is read in the same way of the main codeword, simplifying the system architecture.

Moreover, since the data stored in the counter may correspond to the difference between the target value and the minimum number of expected bits having the first logic value (i.e. Min1, that is the minimum number of is that are to be stored in the codeword) instead of the target value only, the counter has a reduced number of bits, much less than the main codeword. Therefore, the present disclosure also leads to a reduced number of cells required for a reliable counting (with reduced power, reduced area).

Figure 6:
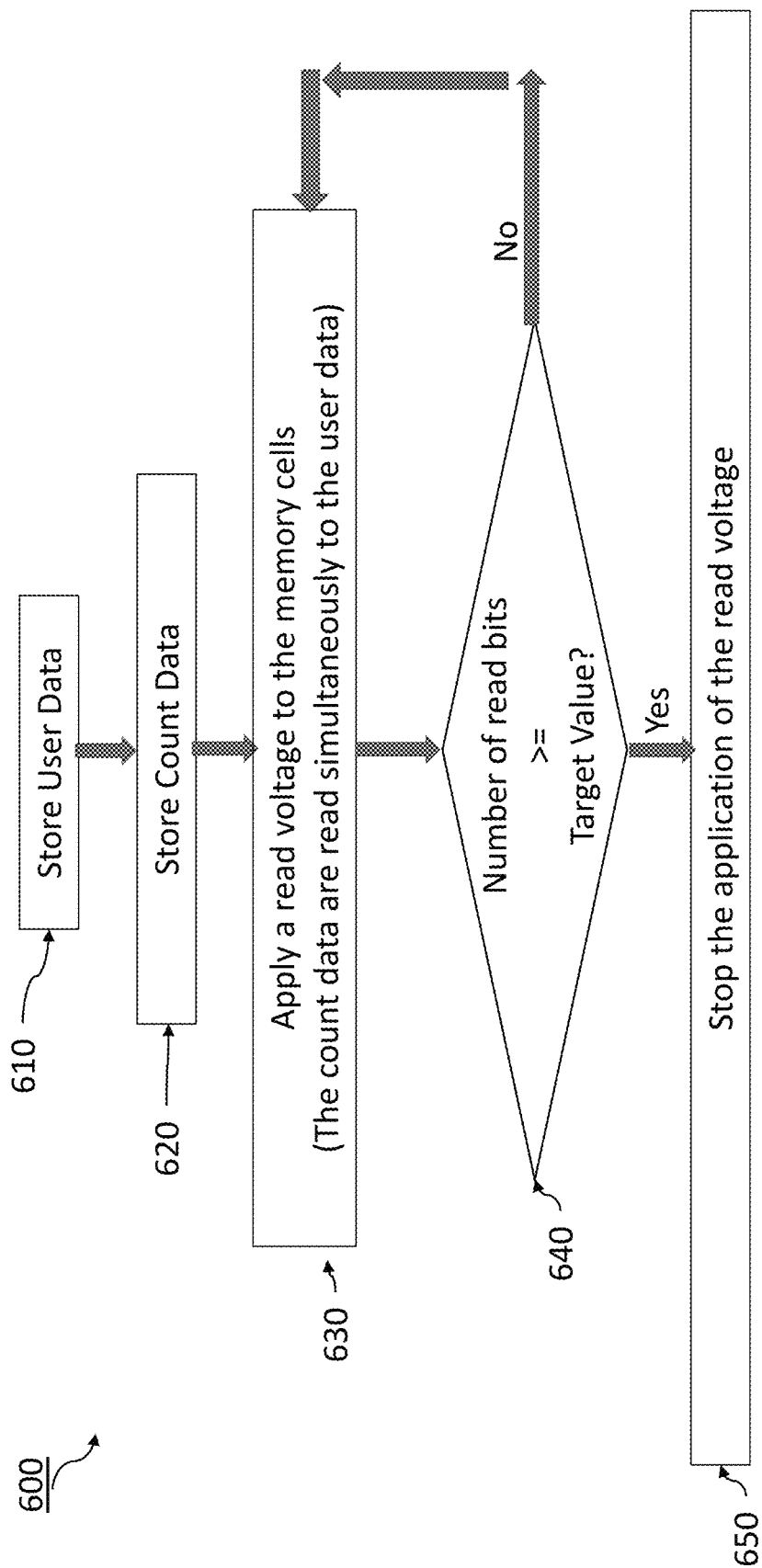
FIG. 6 is a flow diagram representing steps of a method according to the present disclosure.

FIG. 6 is flow chart representing steps of a method 600 according to the present disclosure. The processes described can be performed by hardware logic and circuitry. For example, the following processes are described as being performed by access circuitry and sense circuitry, as disclosed herein. However, other embodiments can include different circuitry configurations suitable for performing the processes.

The method of the present disclosure is a method for improving read operations of memory cells. Prior to reading the memory cells, access circuitry writes data to a plurality of memory cells. For example, access circuitry writes logic 0s and logic is to a plurality of memory cells such as the memory cell 100' of FIG. 1. In one embodiment, access circuitry can write logic 0s by applying programming pulses with a negative polarity and logic is by applying programming pulses with a positive polarity. The opposite convention can also be adopted. After writing data to the plurality of memory cells, access circuitry can read the plurality of memory cells using the read sequence of the present disclosure.

More in particular, at step 610, user data are stored in a plurality of memory cells of a memory array and, at step 620, count data corresponding to a number of bits in the user data having a predetermined first logic value are stored in a counter associated to the array of memory cells. In some cases, user data may be encoded prior to storing, for example to have the number of bits in a range. In some examples, count data may be indicative of a difference between a target value of bits in the user data having the first logic value and a minimum value of bits in the user data having said first logic value.

At step 630, a read voltage is applied to the memory cells to read the user data stored in the array of memory cells. The read voltage applied to memory cells storing user data may be a first read voltage. At the same time, the read voltage is applied to the cells of the counter to read the count data stored in the counter and to provide a target value corresponding to the number of bits in the user data having the first logic value. The read voltage applied to memory cells storing counter data may be a second read voltage. The second read voltage may be offset with respect to the first read voltage, in some embodiments. According to the present disclosure, during the application of the read voltage(s), the count data are read simultaneously to the user data in such a way that the target value is provided during the reading of the user data.

At step 640 the number of read user data bits (which is counted by incrementing a dedicated counter) is compared with the target value.

Based on the target value of the counter, the application of the read voltage, e.g., the first read voltage, is stopped at step 650 when the number of bits in the user data having the first logic value corresponds to the target value. Alternatively, method 600 continues (e.g., from step 630, with increased read voltage(s)). In some examples, the first and second read voltages may be voltage ramps, e.g., staircase voltage ramps.

Figure 7:
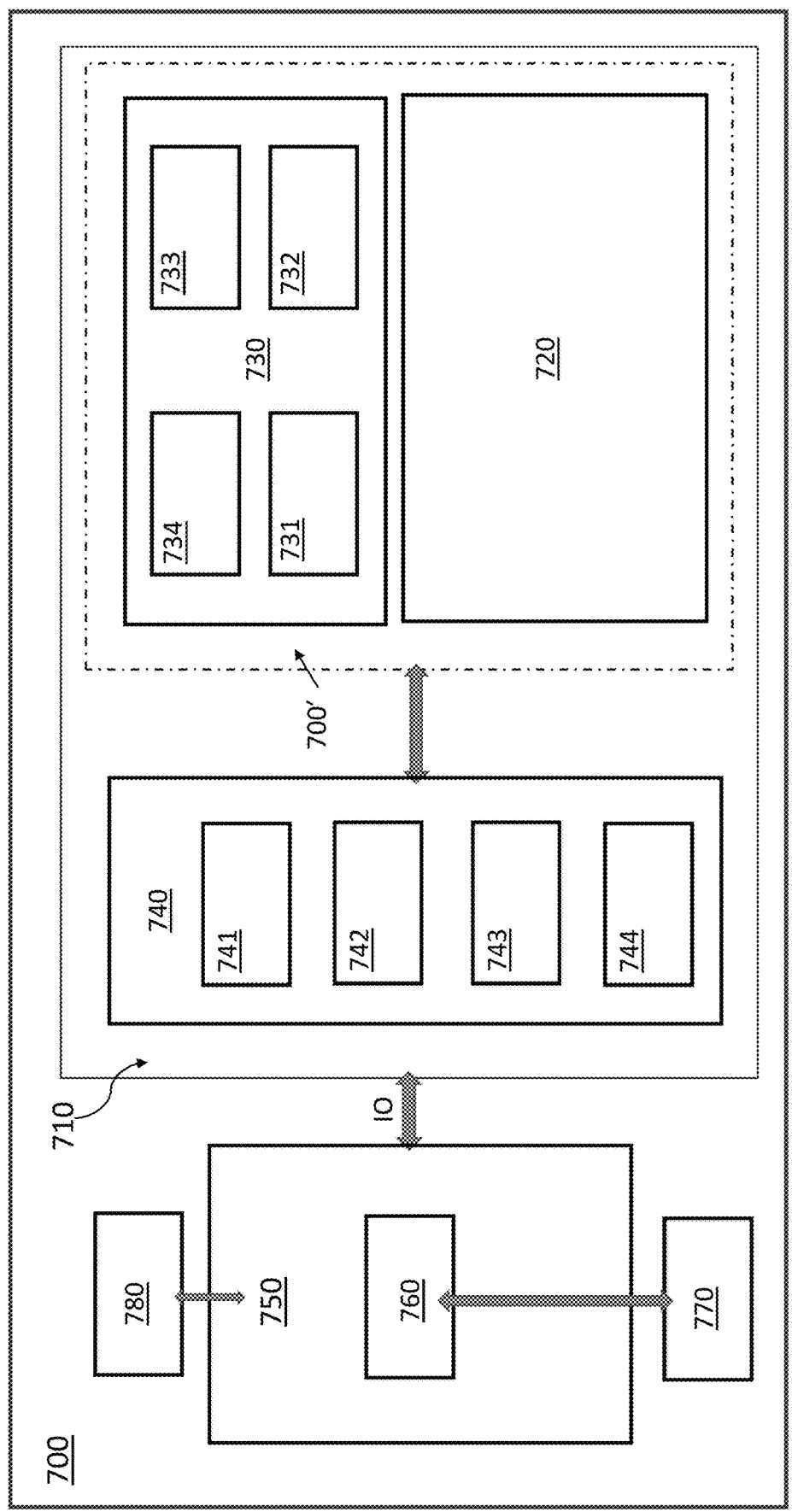
FIG. 7 shows a schematic block diagram of a system including a memory device according to the disclosure.

FIG. 7 is a high-level scheme of a system 700 that can perform the read algorithm of the present disclosure. The system 700 includes a memory device 710 in turn including an array of memory cells 720 and a circuit 730 operatively coupled to the memory cells 720; the memory cells 720 and the circuit 730 form a memory portion, herein referred to as memory portion 700'.

The memory device 710 comprises a memory controller 740, which represents control logic that generates memory access commands, for example in response to command by a host 750. Memory controller 740 accesses memory portion 700'. In one embodiment, memory controller 740 can also be implemented in the host 750, in particular as part of a host processor 760, even if the present disclosure is not limited by a particular architecture. The controller 740 can include an embedded firmware and is adapted to manage and control the operation of the memory portion 700'.

In general, the memory controller 740 may receive user data through input/output IO. As shown before, in some embodiments, the memory controller encodes the user data to satisfy a condition prior to storing the user data in memory cells. The condition may be satisfied when encoded user data have a predetermined number of bits exhibiting a given logic value (e.g., a logic value of 1). As a way of example, the encoded user data may be configured to have 50% of the memory cells storing the encoded user data to exhibit the logic state of 1 while the other 50% of the memory cells to exhibit a logic state of 0 (i.e. the balanced encoding scheme, where half of the encoded user data bits have a logic state of 1, and the other half have a logic state of 0). During the encoding process, the memory controller 140 may add a certain number of bits (e.g., parity bits) to the user data to establish the predetermined number of memory cells to exhibit the given logic state. As a result of adding the parity bits, the encoded user data may have more bits than the user data. In some embodiments, a different percentage value (e.g., 40%, 60%, 75%) of the memory cells exhibiting the logic state of 1 may be employed during the encoding process.

Count data may be defined as the number of bits of the encoded user data having given logic state (e.g., a logic state of 1), and the value of the count data may be encoded and stored by the memory controller 740 in the array as a codeword portion.

The controller 740 may be configured to manage the simultaneous reading of user data and count data and, based on the target value, may be configured to stop the reading of the user data when the number of bits in the user data having the first logic value is equal to the target value.

The memory device 710 can also comprise other components, such as processor units coupled to the controller 740, antennas, connection means (not shown) with the host device, and the like.

Multiple signal lines couple the memory controller 740 with the memory portion 700'. For example, such signal lines may include clock, command/address and write data (DQ), read DQ, and zero or more other signal lines. The memory controller 740 is thus operatively coupled to the memory portion 700' via suitable buses.

The memory portion 700' represents the memory resource for the system 700. In one embodiment, the array of memory cells 720 is managed as rows of data, accessed via wordline (rows) and bitline (individual bits within a row) control. In one embodiment, the array 720 of memory cells includes a 3D crosspoint array such as the memory cell array 200 of FIG. 2. The array 720 of memory cells can be organized as separate channels, ranks, and banks of memory. Channels are independent control paths to storage locations within memory portion. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, the memory controller 740 includes refresh (REF) logic 741. In one embodiment, refresh logic 741 indicates a location for refresh, and a type of refresh to perform. Refresh logic 741 can trigger self-refresh within memory, and issue external refreshes by sending refresh commands to trigger the execution of a refresh operation.

In one embodiment, access circuitry 731 of the circuit 730 performs a refresh (e.g., reprogramming) of any of the accessed memory cells that were not refreshed during the read sequence. Therefore, a complete refresh of memory cells can be achieved as mostly a side effect of the memory read sequence with minimal additional refresh operations.

In an embodiment, the circuit can also be embedded in the memory controller, even if the present disclosure is not limited by a particular architecture.

In the exemplary embodiment illustrated in FIG. 7, the memory controller 740 includes error correction circuitry 742. The error detection/correction circuitry 742 can include hardware logic to implement an error correction code (ECC) to detect errors occurring in data read from memory portion. In one embodiment, error detection/correction circuitry 742 also corrects errors (up to a certain error rate based on the implemented ECC code). However, in other embodiments, error detection/correction circuitry 742 only detects but does not correct errors.

In the illustrated embodiment, the memory controller 740 includes command (CMD) logic 743, which represents logic or circuitry to generate commands to send to memory portion. The memory controller 740 may also include a counter 744, such as the per-codeword counter disclosed above and configured to count the number of bits switched during the read operation. Clearly, also other architectures can be employed, for example the counter can be embedded in the host 750 or also in the circuit 730.

Based on the received command and address information, access circuitry 731 of the circuit 730 performs operations to execute the commands, such as the read operation of the present disclosure. In one such embodiment, the circuit 730 includes sense circuitry 732 to detect electrical responses of the one or more memory cells to the applied read voltage. In one embodiment, the sense circuitry 732 include sense amplifiers. FIG. 7 illustrates the access circuitry 731 and sense circuitry 732 as being embedded in the memory portion 700', however, other embodiments can include access circuitry and/or sense circuitry that is separate from the memory portion 700'. For example, access circuitry and sense circuitry can be included in a memory controller such as the memory controller 740.

Sense circuitry may be configured to detect a current through a given memory cell in response to the read voltage, wherein the access circuitry is configured to determine that the given memory cell is in the first logic state based on detection that a magnitude of the current is greater than or equal to a threshold current.

In one embodiment, memory portion 700' includes one or more registers 733. The registers 733 represent one or more storage devices or storage locations that provide configuration or settings for the operation of the memory portion. Furthermore, in one embodiment, the circuit 730 includes also decode circuitry 734.

The host device 750 is a computing device in accordance with any embodiment described herein, and can be a laptop computer, a desktop computer, a server, a gaming or entertainment control system, a scanner, copier, printer, routing or switching device, embedded computing device, or other electronic device such as a smartphone. The memory device 710 may also be embedded in the host device 750.

In one embodiment, the system 700 includes an interface 770 coupled to the processor 760, which can represent a higher speed interface or a high throughput interface for system components that needs higher bandwidth connections, and/or graphics interface components. Graphics interface interfaces to graphics components for providing a visual display to a user of system 700. In one embodiment, graphics interface generates a display based on data stored in the memory device or based on operations executed by processor or both.

The system may also comprise network interface 780 communicatively coupled to the host or to memory device for example for connecting with other systems, and/or a battery coupled to provide power to said system.

In conclusion, the present disclosure provides a simultaneous reading of the counter bits and the other bits of a codeword, improving the performances of the array.

According to an exemplary embodiment, a method for operating (accessing) an array of memory cells comprises the steps of storing user data in a plurality of memory cells of a memory array, storing, in a counter associated to the array of memory cells, count data corresponding to a number of bits in the user data having a predetermined first logic value, applying a read voltage (e.g., a first read voltage) to the memory cells to read the user data stored in the array of memory cells, applying a read voltage (e.g., a second read voltage) to the cells of the counter to read the count data stored in the counter and to provide a target value corresponding to the number of bits in the user data having said first logic value, wherein, during the application of said read voltages, the count data are read simultaneously to the user data in such a way that the target value is provided during the reading of the user data, and based on the target value of the counter, stopping the application of the read voltage when the number of bits in the user data having the first logic value is equal to said target value.

According to another exemplary embodiment, a method for programming and reading memory cells in vertical 3D memory devices comprising one or more memory array comprises the steps of storing a codeword in the memory array including user data and count data, the count data corresponding to a number of bits in the user data having a predetermined first logic value, storing, in the counter, the difference between the target value and the minimum value of bits in the user data having said first logic value to be stored in the codeword, applying a (first) read voltage to the memory cells to read the user data stored in the array of memory cells, applying a (second) read voltage to the cells of the counter to read the count data stored in the counter and to provide a target value corresponding to the number of bits in the user data having said first logic value, wherein, during the application of said read voltages, the count data are read simultaneously to the user data in such a way that the target value is provided during the reading of the user data, and based on the target value of the counter, stopping the application of the read voltage when the number of bits in the user data having the first logic value is equal to said target value.

The present disclosure also discloses a memory device comprising one or more arrays of memory cells, at least a codeword in said memory array including user data and count data, the count data corresponding to a number of bits in the user data having a predetermined first logic value, a memory controller supporting a counter-based method for reading the memory cells, and a circuit for reading the memory cells, the circuit being operatively coupled with the array of memory cells and comprising at least an access circuit configured to apply a first read voltage to the memory cells to read the user data stored in the array of memory cells, and apply a second read voltage to the cells of the counter to read the count data stored in the counter and to provide a target value corresponding to the number of bits in the user data having said first logic value, wherein, during the application of said read voltages, the count data are read simultaneously to the user data in such a way that the target value is provided during the reading of the user data, as well as comprising a sense circuit configured to detect threshold voltages exhibited by the plurality of memory cells in response to application of the read voltage, wherein, based on the target value of the counter, the controller is configured to stop the application of the read voltage when the number of bits in the user data having the first logic value is equal to said target value. In an embodiment, the array of memory cells comprises a Self-Selecting Memory (SSM) or a 3D cross point (3D X Point) memory.

A related system, comprising a host device and a memory device as above is also disclosed, the system comprising for example any of a display communicatively coupled to the memory device or to the host, a network interface communicatively coupled to the memory device or to the host, and a battery coupled to provide power to said system.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method, comprising:
    applying a first read voltage to an array of memory cells to read user data stored in the memory cells;
    applying a second read voltage to cells of a counter to read count data stored in the counter and to provide a target value corresponding to a number of bits in the user data having a predetermined first logic value; and
    stopping the applying of the first read voltage when the number of bits in the user data having the predetermined first logic value as read via the first read voltage corresponds to the target value represented by the counter data as read via the second read voltage.

2. The method according to claim 1, wherein the user data is encoded in a codeword having a number of bits exhibiting the first logic value.

3. The method according to claim 2, wherein the user data is encoded to have substantially a same number of bits exhibiting the first logic value and a second logic value.

4. The method according to claim 1, wherein the counter is associated with the array of memory cells to store the count data; and wherein the count data represents a difference between the target value and a minimum count of bits of a codeword usable to encode the user data and having the first logic value.

5. The method according to claim 1, wherein bits stored in the counter are stored and read according to a majority voting scheme.

6. The method according to claim 1, further comprising balancing bits in the counter to include a predetermined number of bits exhibiting the first logic value via manipulating extra bits.

7. The method according to claim 6, further comprising stopping the applying of the second read voltage to provide the target value when the predetermined number of bits in the counter exhibiting the first logic value is read via the second read voltage.

8. The method according to claim 7, further comprising generating a command to enable the applying of the second read voltage until the predetermined number of bits in the counter exhibiting the first logic value is read and the target value is provided.

9. The method according to claim 1, further comprising counting bits of the counter being read during the applying of the second read voltage, starting from a maximum number with a decrement each time a bit of the counter is read.

10. The method according to claim 1, wherein the second read voltage is voltage offset with respect to the first read voltage.

11. The method according to claim 1, wherein the user data are protected using an Error Correction Code (ECC), or a differential cells scheme, or both.

12. The method of claim 1, wherein the memory cells are configured to exhibit a threshold voltage with a lower magnitude when the memory cells are in a first logic state representative of the first logic value, and a threshold voltage with a higher magnitude when the memory cells are in a second logic state and wherein a logic state of a given cell among the array of memory cells is determined based on whether the given cell exhibits a higher or lower magnitude threshold voltage in response to the first read voltage.

13. The method of claim 1, wherein the user data stored in the array of memory cells is evaluated during the applying of the first read voltage.

14. The method of claim 1, wherein the user data stored in the array of memory cells is evaluated after the target value is read.

15. The method of claim 1, further comprising transmitting the target value to a Lookup Table (LUT) and receiving data from the Lookup Table to generate the first read voltage applied to the memory cells.

16. A memory device, comprising:
    an array of memory cells, configured to store user data;
    cells of a counter, configured to store count data identifying a number of bits in the user data having a predetermined first logic value;
    a controller; and
    a circuit controllable by the controller to read the memory cells;
    wherein the circuit is configured to, during reading the memory cells:
        apply a first read voltage to the memory cells to read the user data stored in the memory cells; and
        apply a second read voltage to the cells of the counter to read the count data stored in the counter and to provide a target value corresponding to the number of bits in the user data having the first logic value; and
    wherein the controller is configured to stop application of the first read voltage when the number of bits in the user data having the first logic value as read via the application of the first read voltage corresponds to the target value represented by the counter data as read via application of the second read voltage.

17. The memory device of claim 16, further comprising:
    an access circuitry; and
    a sense circuitry configured to detect threshold voltages exhibited by the memory cells storing the user data in response to the application of the first read voltage;
    wherein the sense circuitry is further configured to detect a first current through a given memory cell in response to the first read voltage; and
    wherein the access circuitry is configured to determine that the given memory cell is in a first logic state representative of the first logic value, based on detection that a magnitude of the first current is greater than or equal to a first threshold current.

18. The memory device of claim 16, wherein the first read voltage is a staircase voltage ramp.

19. The memory device of claim 18, wherein the second read voltage is a second voltage ramp offset with respect to the staircase voltage ramp.

20. The memory device of claim 16, wherein the controller is configured to generate a command to enable reading of the user data in the memory cells until the target value of the counter is read.

21. The memory device of claim 16, wherein bits of the counter are inverted; and the circuit is configured to count the bits of the counter being read via application of the second read voltage, starting from a maximum number with a decrement each time a bit of the counter is read.

22. The memory device of claim 16, configured to store a Lookup Table (LUT) containing information to generate the first read voltage.

23. The memory device of claim 16, wherein the array of memory cells comprises a Self-Selecting Memory (SSM) or a 3D cross point (3D X Point) memory.

24. A method comprising:
- storing, in an array of memory cells, a codeword including user data;
- storing, in cells of a counter, count data, the count data identifying a number of bits in the user data having a predetermined first logic value;
- applying a read voltage to the memory cells to read the user data stored in the memory cells;
- applying an offset read voltage to the cells of the counter to read the count data stored in the counter and to provide a target value corresponding to the number of bits in the user data having the first logic value; and
- stopping the applying of the read voltage when the number of bits in the user data having the first logic value as read via the read voltage corresponds to the target value represented by the counter data as read via the applying of the offset read voltage.

* * * * *